(12) United States Patent
Van Herpen et al.

(10) Patent No.: US 8,093,789 B2
(45) Date of Patent: Jan. 10, 2012

(54) LIGHT OUTPUT DEVICE

(75) Inventors: Maarten Marinus Johannes Wilhelmus Van Herpen, Eindhoven (NL); Markus Cornelius Vermeulen, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 90 days.

(21) Appl. No.: 12/602,684

(22) PCT Filed: Jun. 2, 2008

(86) PCT No.: PCT/IB2008/052137
§ 371 (c)(1),
(2), (4) Date: Dec. 2, 2009

(87) PCT Pub. No.: WO2008/149276
PCT Pub. Date: Dec. 11, 2008

(65) Prior Publication Data
US 2010/0176705 A1 Jul. 15, 2010

(30) Foreign Application Priority Data
Jun. 8, 2007 (EP) .................................. 07109836

(51) Int. Cl.
*H01J 1/62* (2006.01)
(52) U.S. Cl. .......... 313/46; 313/504; 313/506; 313/512; 362/800

(58) Field of Classification Search .................. None
See application file for complete search history.

(56) References Cited

U.S. PATENT DOCUMENTS

| 5,218,351 | A | 6/1993 | Hashikawa |
| 6,375,340 | B1 | 4/2002 | Biebl et al. |
| 6,867,542 | B1 | 3/2005 | Sun et al. |
| 7,043,881 | B2 | 5/2006 | Krause, Sr. et al. |
| 7,049,745 | B2 * | 5/2006 | Cok ............................ 313/512 |
| 7,196,354 | B1 | 3/2007 | Erchak et al. |
| 2005/0225222 | A1 * | 10/2005 | Mazzochette et al. .......... 313/46 |
| 2006/0275599 | A1 * | 12/2006 | Lefevre ......................... 428/332 |
| 2006/0289875 | A1 | 12/2006 | Shieh et al. |

FOREIGN PATENT DOCUMENTS

| EP | 1437215 A1 | 7/2004 |
| EP | 1886804 A1 | 2/2008 |
| WO | 2006033998 A1 | 3/2006 |
| WO | WO-2007057459 | * 5/2007 |
| WO | 2007071724 A1 | 6/2007 |
| WO | WO-2007104729 | * 9/2007 |

* cited by examiner

*Primary Examiner* — Ashok Patel
(74) *Attorney, Agent, or Firm* — John F. Salazar; Mark L. Beloborodov

(57) ABSTRACT

A light output device comprises a substrate arrangement with a light source device integrated into the structure of the substrate arrangement. The substrate arrangement comprises first and second optically transmissive substrates, an insulating layer in which the light source device is embedded and provided between the substrates, and a thermally conductive layer provided on at least on of the substrates.

17 Claims, 6 Drawing Sheets

LIGHT OUTPUT DEVICE

FIELD OF THE INVENTION

This invention relates to a light output device, in particular using a light source associated with a light transmissive substrate structure.

BACKGROUND OF THE INVENTION

One known example of this type of lighting device is a so-called "LED in glass" device. An example is shown in FIG. 1. Typically a glass plate is used, with a transparent conductive coating (for example ITO) forming electrodes. The conductive coating is patterned in order to make the electrodes, that are connected to a semiconductor LED device. The assembly is completed by laminating the glass, with the LEDs inside a thermoplastic layer (for example polyvinyl butyral, PVB).

Applications of this type of device are shelves, showcases, facades, office partitions, wall cladding, and decorative lighting. The lighting device can be used for illumination of other objects, for display of an image, or simply for decorative purposes.

One problem with this type of device is that the layer which encases the LEDs within the structure should not be overheated, because otherwise it will lead to damage in the layer (for example PVB). Additionally also the LED itself should not be overheated (in particular the junction temperature should not become too high), because otherwise the LED lifetime goes down. The glass itself is typically not sufficiently thermally conducting to sink the heat away, so additional precautions have to be taken. Currently the maximum allowed power for the LEDs is limited (for example to 0.3 Watt). By limiting the operating current of the LEDs, a visible shift in color temperature can result. Hence, for cost as well as performance, the LEDs should be operating close to their nominal power which is currently not possible when using for example 1 Watt LEDs.

It is an object of the invention to provide a structure which allows the LEDs to be operated at a desired power level without risking damage to the device structure.

SUMMARY OF THE INVENTION

According to the invention, there is provided a light output device comprising a substrate arrangement with at least one light source device integrated into the structure of the substrate arrangement, wherein the substrate arrangement comprises:
  at least one light transmissive substrate;
  a thermally insulating layer in thermal contact with the at least one light source device; and
  a thermally conductive layer in thermal contact with the at least one light source device.

By providing a thermally conductive layer in order to conduct the heat away from the light source device (typically an LED), the heat is spread over a larger area, resulting in better cooling for the system. As a result, the LEDs may be driven at a higher power.

The light source device may be at least partly embedded in the thermally insulating layer. Furthermore, the thermally insulating layer may be provided over the at least one substrate.

The light transmissive substrate material may be transparent (optically clear) or a diffusive transmissive material.

The thermally conductive layer may be applied in the form of a coating.

There may be two substrates between which the light source device is sandwiched, and one or both of them can be provided with a preferably transparent, thermally conductive layer.

The or each thermally conductive layer preferably has a thermal resistance less than 10% of the thermal resistance of the substrate on which it is provided. This prevents the layer acting as a thermal insulator. The or each thermally conductive layer can have a thermal resistance less than 8.5 K/W.

The thermally insulating layer preferably has a thermal conductivity of less than 1 W/mK, preferably less than 0.2 W/mK, and may be a thermoplastic, or resin layer.

The or each thermally conductive layer preferably has a thickness d and a heat conductivity K which satisfy K.d>0.002, in units of W/K. This provides sufficient heat dissipation to allow increased power of operation of the light output devices. The values may satisfy K.d>0.003 or even K.d>0.004.

The or each thermally conductive layer can comprise one or more of diamond-like-carbon, MgO Si3N4, silver and copper (the latter two being suitable for silkscreen printing).

The substrate arrangement may further comprise an electrode arrangement sandwiched between the substrates, wherein the at least one light source device is connected to the electrode arrangement. The electrode arrangement comprises preferably an at least semi-transparent conductor arrangement, for example substantially transparent Indium Tin Oxide, Indium Zinc Oxide, Tin Oxide or Fluorine Doped Tin Oxide.

Alternatively, the electrode arrangement can comprise a preferably semi-transparent conductive material, for example gold, silver, copper, zinc or stainless steel. The preferably semi-transparent conductive material can comprise an ink containing conductive particles.

The light source device may comprise a LED device, for example inorganic LED, organic LED, polymer LED or laser diode. The light source device may also comprise several LED devices.

The invention also provides lighting system comprising a light output device of the invention, and a controller for controlling the signals provided to the light source device.

It is noted that the invention relates to all possible combinations of features recited in the claims.

BRIEF DESCRIPTION OF THE DRAWINGS

Examples of the invention will now be described in detail with reference to the accompanying drawings, in which.

The same reference numbers are used to denote similar parts in the different figures.

DETAILED DESCRIPTION

Figure 1:
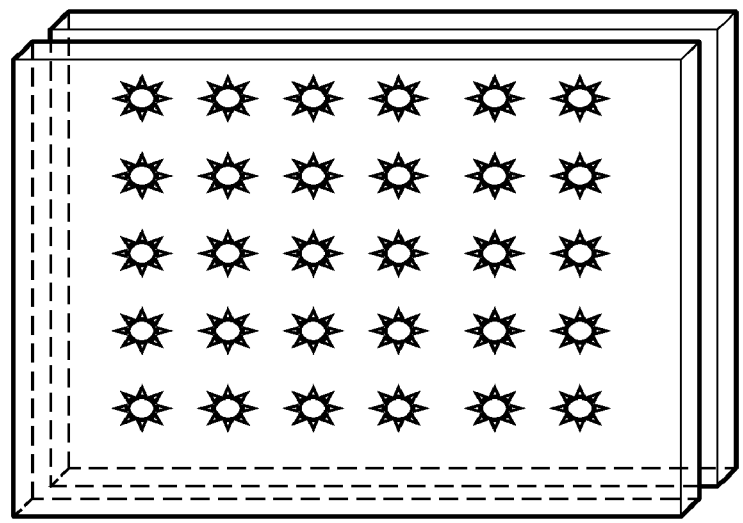
FIG. 1 shows a known LED in glass illumination device.
Figure 2:
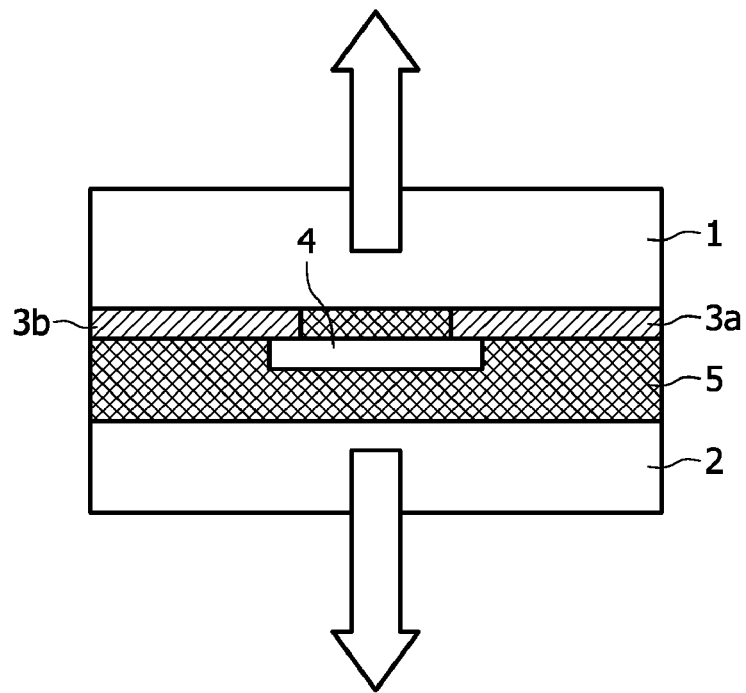
FIG. 2 shows a single LED of the device of FIG. 1 in more detail.

The structure of an LED in glass illumination device is shown in FIG. 2. The lighting device comprises glass plates 1 and 2. Between the glass plates are preferably (semi-) transparent electrodes 3a and 3b (for example formed using ITO), and a LED 4 connected to the preferably transparent electrodes 3a and 3b. A layer of plastic material 5 is provided between glass plates 1 and 2 (for example PVB or UV resin).

The glass plates typically may have a thickness of 1.1 mm-2.1 mm. The spacing between the electrodes connecting to the LED is typically 0.01-3 mm, for example around 0.15 mm. The thermoplastic layer has a typical thickness of 0.3 mm-2 mm, and the electrical resistance of the electrodes is in the range 2 -80 Ohm, or 10-30 Ohms/square.

The electrodes are preferably substantially transparent, so that they are imperceptible to a viewer in normal use of the device. If the conductor arrangement does not introduce a variation in light transmission (for example because it is not patterned, or because the pattern cannot be seen), a transparency of greater than or equal to 50% may be sufficient for the system to be transparent. More preferably, the transparency is greater than 70%, more preferably 90%, and even more preferably 99%. If the conductor arrangement is patterned (for example because thin wires are used), the transparency is preferably greater than 80%, more preferably 90%, but most preferably greater than 99%.

The electrodes can be made of a transparent material such as ITO or they can be made of an opaque material such as copper but be sufficiently thin so that they are not visible in normal use. Examples of suitable materials are disclosed in U.S. Pat. No. 5,218,351.

In other embodiments, the conductor arrangement does not need to be transparent, for example if illumination is to be provided from only one face of the device.

The invention provides a heat-conductive layer on one or both glass sheets, in order to conduct the heat away from the LED. This spreads the heat over a larger area, resulting in better cooling for the system. As a result, the LEDs may be driven at a higher power.

Figure 3:
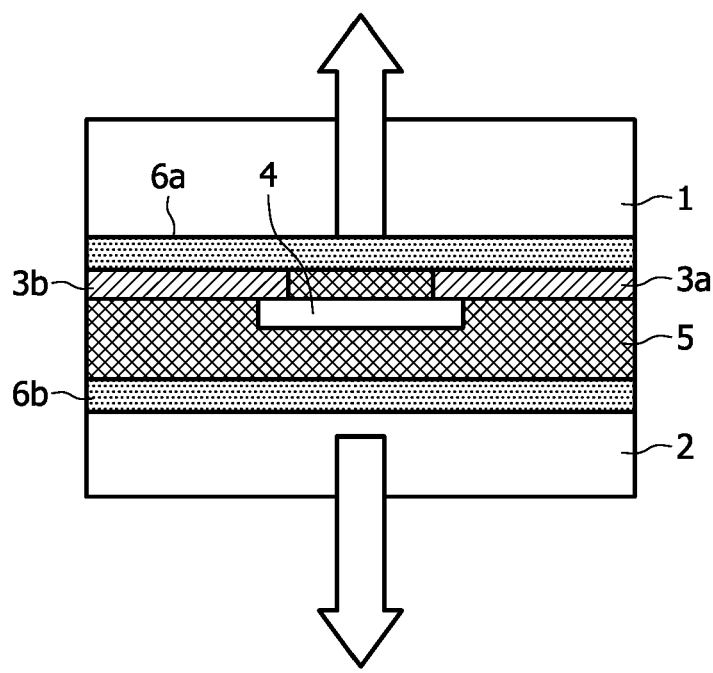
FIG. 3 shows a first example of LED in glass device of the invention

FIG. 3 shows a first example of circuit of the invention. As in FIG. 2, glass plates 1 and 2 are provided. Between the glass plates are preferably transparent electrodes 3a and 3b (for example using ITO), and a LED 4 connected by preferably transparent electrodes 3a and 3b. There is also the layer of plastic material 5 between glass plates 1 and 2 (for example PVB).

At least one of the glass plates 1,2 is coated with a preferably optically transparent, thermally conductive layer 6a and/or 6b, in order to reduce the heat load for the LED 4.

Table 1 shows some typical values for the thermal conductivity of the various materials used for the embodiment shown in FIG. 3. From this table, it is clear that the PVB layer has a very low thermal conductivity compared to the other materials. Thus, it is expected that the heat-transfer through the PVB layer is very limited.

TABLE 1

Thermal conductivity of several materials.

| Material | Thermal conductivity (W/mK) | Used for component. |
|---|---|---|
| Glass | 1.05 | Glass plate 1 and 2. |
| PVB | 0.12 | Thermoplastic layer 5. |
| ITO | 8.7 | Electrodes 3a, 3b. |
| Si3N4 | 30 | Thermal layer 6. |
| Diamond, DLC | 1000-2000 | Thermal layer 6. |
| MgO | 53.5 | Thermal layer 6. |
| Cu | ~400 | Thermal layer 6. |

Figure 4:
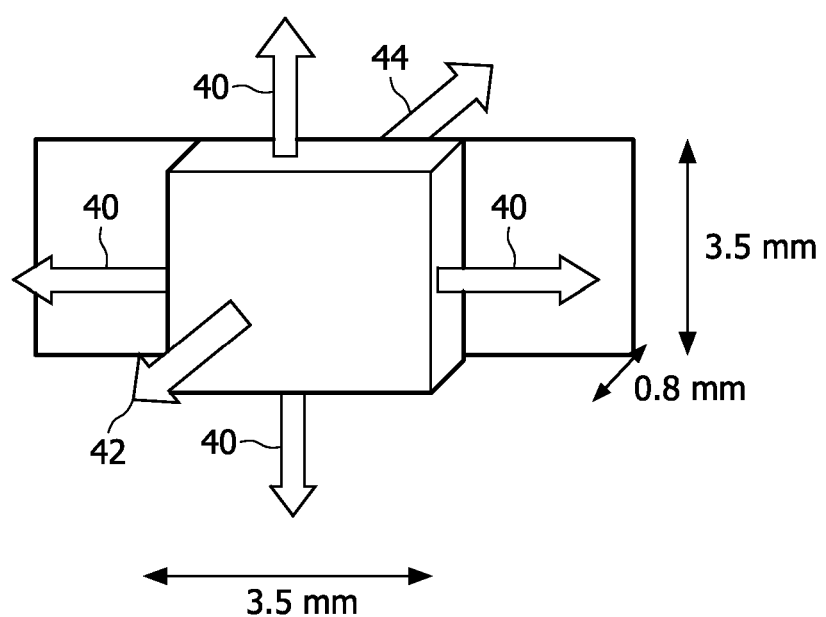
FIG. 4 shows the dimensions of a typical LED for analysis purposes.

FIG. 4 shows typical dimensions for the LED 4, showing flow directions of heat. The arrows 40 indicate heat transfer in lateral direction through the PVB, the arrow 42 indicates heat conduction through the PVB towards the upper glass plate and the arrow 44 indicates heat conduction through the ITO layer and the bottom glass plate.

As shown, typical dimensions for the LED are 3.5 mm×3.5 mm×0.8 mm. The PVB layer thickness is typically available in units of 0.38 mm. A preferred thickness is therefore 1.14 mm.

It is possible to distinguish between the three different paths of heat conduction:
(i) Heat conduction in a lateral direction through the PVB.
(ii) Heat conduction through the PVB, followed by the upper glass plate.
(iii) Heat conduction through the ITO layer and the bottom glass plate (where the "bottom" glass plate is defined as the one on which the LED is mounted, i.e. glass plate 1 in FIG. 3).

The efficiency of these heat conduction paths is analysed below. The following conclusions can be drawn:

Conduction path (i) is too low to be of any influence. The effect can be neglected.

Conduction path (iii) is significantly more efficient than conduction path 2. For a typical case, it can be shown that 80% of the heat is conducted through path (iii) (using 0.4 W of heat per LED, and using typical geometries of 3.5 mm×3.5 mm×0.8 mm for the LED, 1.14 mm thickness for the PVB and 1.1 mm thickness for the glass plate).

In order to calculate if the heat conduction paths outlined above are effective, Fourier's Law can be applied:

$$q = k \cdot A \cdot dT/s$$

where
q=heat transferred per unit time (W)
A=heat transfer area (m$^2$)
k=thermal conductivity of the material (W/m.K or W/m.° C.)
dT=Temperature difference across the material (K or ° C.)
s=material thickness (m)

Using this equation, it is possible to write the following expressions for the three heat conductive paths:
(i) Heat conduction in lateral direction through the PVB.

$$q_{PVB} = 0.12 \cdot 3.5 \times 10^{-3} \cdot 0.8 \times 10^{-3} \cdot 4 \cdot dT/s = 1.3 \times 10^{-6} \cdot dT/s \quad (1)$$

(ii) Heat conduction through the PVB, followed by the upper glass plate.

$$q_{PVB} = 0.12 \cdot 3.5 \times 10^{-3} \cdot 3.5 \times 10^{-3} \cdot dT/s = 1.47 \times 10^{-6} \cdot dT/s$$

$$q_{glass} = 1.05 \cdot 3.5 \times 10^{-3} \cdot 3.5 \times 10^{-3} \cdot dT/s = 12.9 \times 10^{-6} \cdot dT/s \quad (2)$$

(iii) Heat conduction through the ITO layer and the bottom glass plate $$q_{ITO} = 8.7 \cdot 3.5 \times 10^{-3} \cdot 3.5 \times 10^{-3} \cdot dT/s = 107 \times 10^{-6} \cdot dT/s$$

$$q_{glass} = 1.05 \cdot 3.5 \times 10^{-3} \cdot 3.5 \times 10^{-3} \cdot dT/s = 12.9 \times 10^{-6} \cdot dT/s \quad (3)$$

A typical maximum power for the LED is 0.7 W. However, normally it is not used at full power, and is typically used at 50% of this maximum to ensure that heat-load does not limit the maximum LED lifetime. A typical efficiency of the LED is 50%. Thus, typically the LED may generate around 0.2 W of heat. In the following calculations, a worst-case estimate of 0.4 W of heat per LED is assumed.

For path (i) to be effective, it should transport the heat over a distance at least equal to the LED width of 3.5 mm. However, a power transport of 0.1 W, combined with a temperature drop of 30° C., results in a distance of s=0.39 mm. Thus, it can be concluded that no significant amount of heat is transferred through path 1.

When ignoring the contribution from path (i), the problem can be simplified. A well-known method is used by which an electrical circuit is used to model the thermal quantities in order to get a first approximation. Table 3 summarizes the analogous equivalences.

TABLE 3

Analogy between thermal and electrical quantities.

| Thermal quantity | Electrical quantity |
|---|---|
| Heat flow q | Current I |
| Temperature difference dT | Voltage V |
| Thermal resistance R | Electrical resistance R |
| Thermal capacitance C | Electrical capacitance C |

Figure 5:
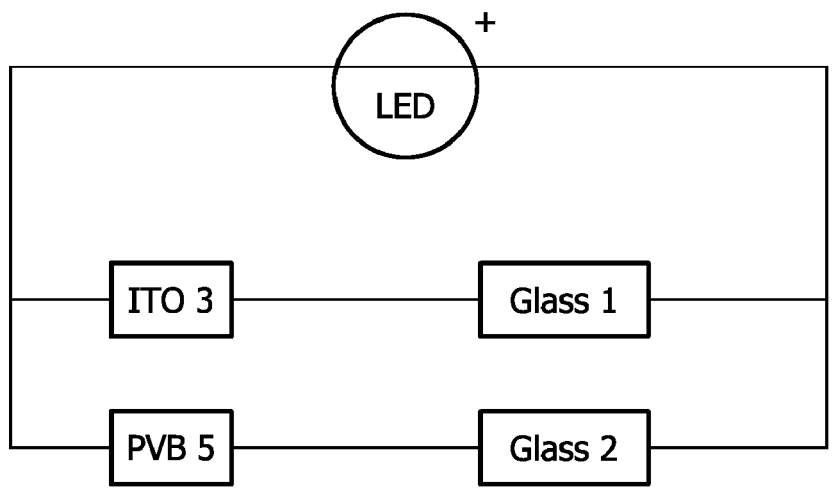
FIG. 5 shows a circuit representing the heat flow in the device of FIG. 3.

FIG. 5 shows the electrical scheme for the heat flow in the prior art LEDs in glass, in which the different layers (ITO electrodes 3a and 3b, PVB layer 5 and glass substrates 1 and 2) are represented as resistances. The LED is shown as a voltage source. The two opposite direction perpendicular heat conduction paths are shown as parallel circuit branches. One end of the branch is at the high LED temperature, and the other is at ambient temperature.

The resistances shown in this scheme can be calculated as follows:

$$R = 1/K \frac{s}{A}$$

Using the known dimensions and heat conductivities:

$$R_{ITO} = 1/8.7(W/mK) \frac{150 \text{ nm}}{(3.5 \text{ mm})^2} = 1.4 \cdot 10^{-3} \frac{K}{W}$$

$$R_{PVB} = 1/0.12(W/mK) \frac{0.34 \text{ mm}}{(3.5 \text{ mm})^2} = 231.3 \frac{K}{W}$$

$$R_{Glass} = 1/1.05(W/mK) \frac{1.1 \text{ mm}}{(3.5 \text{ mm})^2} = 85.5 \frac{K}{W}$$

Using these values it is possible to calculate the resistances for the individual paths through upper glass plate 1 and through lower glass plate 2.

$$R_{upper\ glass\ plate\ 1} = R_{Glass} + R_{ITO} = R_{Glass} = 85.5\ K/W$$

$$R_{lower\ glass\ plate\ 2} = R_{Glass} + R_{PVB} = 316.8\ K/W$$

The ratio between these two values gives the ratio in the amount of heat flow through these paths. Thus, for this case it can be concluded that ~80% of the heat is conducted through glass plate 1. This is due to the high heat resistance of the PVB layer. If the PVB layer is made thicker, for example by adding another layer of 0.38 mm, the amount of heat flow through the bottom glass plate increases to ~90%.

It should be noted that this calculation is just an approximation. Additionally, it is assumed that the bottom and upper glass plates have the same temperature. In practice the temperature of the glass plate 1 will be hotter, due to a higher heat conduction.

Based on this analysis, it can be concluded that the layer 6 is especially useful when it is used near the LED. This is layer 6a in FIG. 3.

Figure 6:
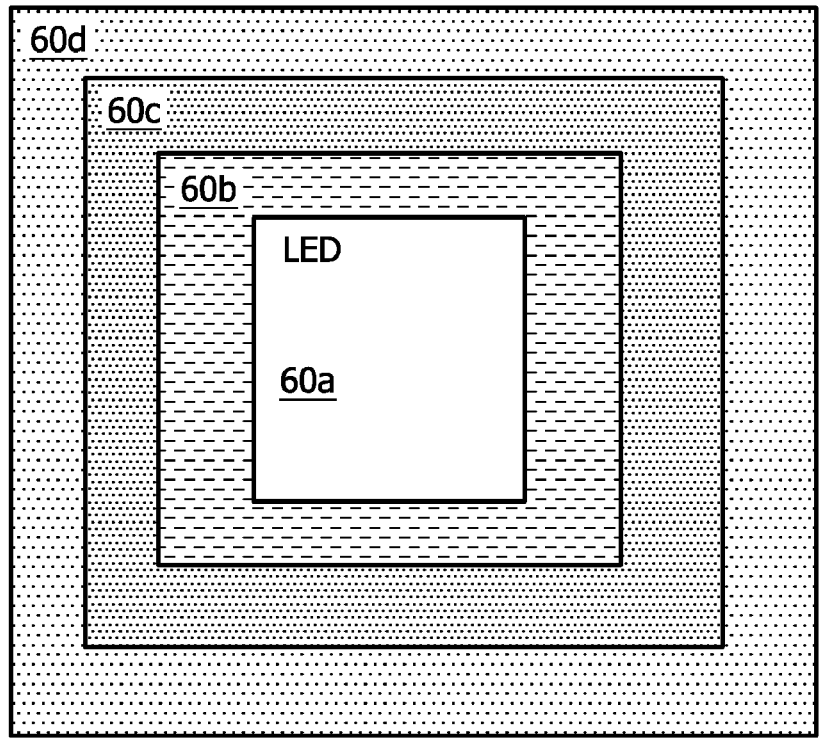
FIG. 6 is used to illustrate the heat transfer from a substrate of the device of FIG. 3.

A numerical and analytical analysis of the required thickness for the layer 6a or 6b is presented below:

The effect of the heat conductive layer 6a or 6b can be modelled by separating the conduction through the layer in steps of 1 mm distance. In the first step the heat is conducted 1 mm laterally away from the LED, and is then transferred through the glass plate. In the next step the heat is conducted 1 mm further laterally away from the LED before it is transferred through the glass plate, etc. This is illustrated in FIG. 6.

The first step 60a is the LED with direct conduction through the glass plate. The $2^{nd}$ step 60b is heat conduction 1 mm away from the LED followed by the glass plate. Similarly, shown as 60c and 60d are heat conduction regions of each 1 further mm away from the LED.

Figure 7:
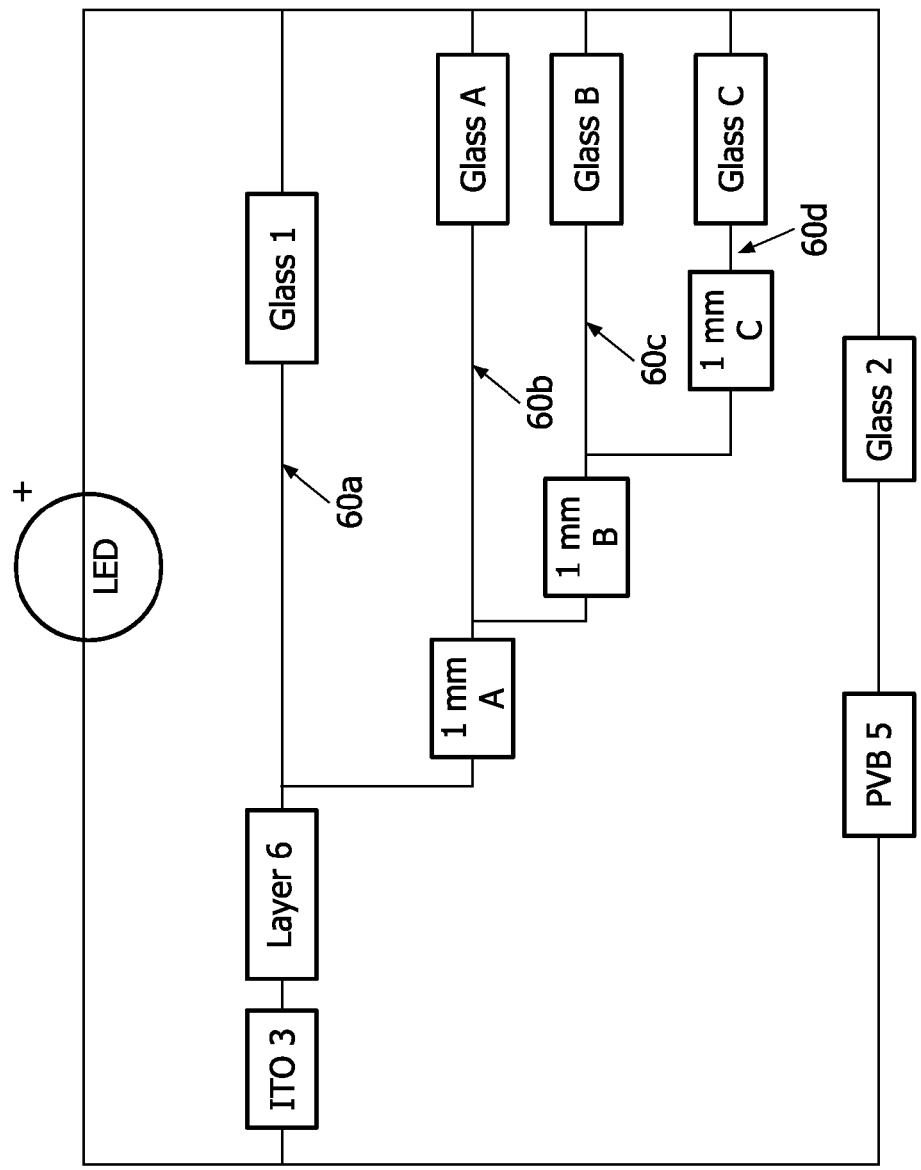
FIG. 7 shows another circuit representing heat flow.

The electrical scheme for the system with 3 steps of 1 mm is shown in FIG. 7. The parallel circuit branches are labeled 60a to 60d to represent the physical regions shown in FIG. 6. The resistances for the components in FIG. 6 can be calculated using $$R = 1/K \frac{s}{A},$$

resulting in:

$$R_{ITO} = 1/8.7(W/mK) \frac{150 \text{ nm}}{(3.5 \text{ mm})^2} = 1.4 \cdot 10^{-3} \frac{K}{W}$$

$$R_{PVB} = 1/0.12(W/mK) \frac{0.34 \text{ mm}}{(3.5 \text{ mm})^2} = 231.3 \frac{K}{W}$$

$$R_{Glass} = 1/1.05(W/mK) \frac{1.1 \text{ mm}}{(3.5 \text{ mm})^2} = 85.5 \frac{K}{W}$$

and:

$$R_{1mmA} = 1/K(W/mK) \frac{1 \text{ mm}}{(4 \times 3.5 \text{ mm} \times d)} = 0.071 \frac{1}{(K \cdot d)}$$

$$R_{1mmB} = 1/K(W/mK) \frac{1 \text{ mm}}{(4 \times 4.5 \text{ mm} \times d)} = 0.0556 \frac{1}{(K \cdot d)}$$

$$R_{1mmC} = 1/K(W/mK) \frac{1 \text{ mm}}{(4 \times 5.5 \text{ mm} \times d)} = 0.0456 \frac{1}{(K \cdot d)}$$

$$R_{glassA} = 1/1.05(W/mK) \frac{1.1 \text{ mm}}{(4.5 \text{ mm})^2 - (3.5 \text{ mm})^2} = 131.0 \frac{K}{W}$$

$$R_{glassB} = 1/1.05(W/mK) \frac{1.1 \text{ mm}}{(5.5 \text{ mm})^2 - (4.5 \text{ mm})^2} = 104.8 \frac{K}{W}$$

$$R_{glassC} = 1/1.05(W/mK) \frac{1.1 \text{ mm}}{(6.5 \text{ mm})^2 - (5.5 \text{ mm})^2} = 87.3 \frac{K}{W}$$

The resistance of the extra conduction through the heat conductive layer 6 can be found by calculating one value representing the resistance of all steps together. This becomes very complex when many steps are done. Due to this the problem can be solved analytically with few steps, or it can be solved numerically.

An analytical approach can be carried out using only two steps, thus using only the regions 60*a*, 60*b*, 60*c* from FIGS. 6 and 7. To start, the following equation describes how to sum the individual contributions:

$$\begin{cases} \dfrac{1}{R_{SUBST1}} = \dfrac{1}{(R_{1mmB} + R_{glass\,B})} + \dfrac{1}{R_{glass\,A}} \\ R_{Extra} = R_{1mmA} + R_{SUBST1} \end{cases}$$

$$\begin{cases} \dfrac{1}{R_{SUBST1}} = \dfrac{1}{(0.0556\,1/(K\cdot d) + 104.8\,K/W)} + \dfrac{1}{131.0\,K/W} \\ R_{Extra} = 0.071\,1/(K\cdot d) + R_{SUBST1} \end{cases}$$

Rsubst1 is the sum of the thermal resistances of "glass A", "glass B" and "1 mmB".

Rextra is the sum of the thermal resistances of "glass A", "glass B" "1 mmB" and "1 mmA", and thus this represents the extra conduction paths added by the conductive layer.

This can be rewritten into:

$$R_{SUBST1} = \frac{131.0 \cdot \left(0.0556\dfrac{1}{(K\cdot d)} + 104.8K/W\right)}{131.0 + \left(0.0556\dfrac{1}{(K\cdot d)} + 104.8K/W\right)}$$

$$R_{Extra} = 0.071\frac{1}{(K\cdot d)} + \frac{131.0 \cdot \left(0.0556\dfrac{1}{(K\cdot d)} + 104.8K/W\right)}{131.0 + \left(0.0556\dfrac{1}{(K\cdot d)} + 104.8K/W\right)}$$

$$R_{Extra} = \frac{0.071\dfrac{1}{(K\cdot d)}\left(235.8 + 0.0556\dfrac{1}{(K\cdot d)}\right) + 131.0 \cdot \left(0.0556\dfrac{1}{(K\cdot d)} + 104.8\right)}{235.8 + 0.0556\dfrac{1}{(K\cdot d)}}$$

$$R_{Extra} = \frac{0.00395\dfrac{1}{(K\cdot d)^2} + 24.03\dfrac{1}{(K\cdot d)} + 13728.8}{235.8 + 0.0556\dfrac{1}{(K\cdot d)}}$$

For a factor of 2 improvement, $R_{extra}$ should be equal to $R_{glass}$:

$$R_{Extra} = \frac{0.00395\dfrac{1}{(K\cdot d)^2} + 24.03\dfrac{1}{(K\cdot d)} + 13728.8}{235.8 + 0.0556\,1/(K\cdot d)} = 85.5$$

$$0.00395\frac{1}{(K\cdot d)^2} + 19.3\frac{1}{(K\cdot d)} - 6432.1 = 0$$

$$1/(K\cdot d) = 313 \rightarrow K\cdot d = 0.0032\,W/K$$

Figure 8:
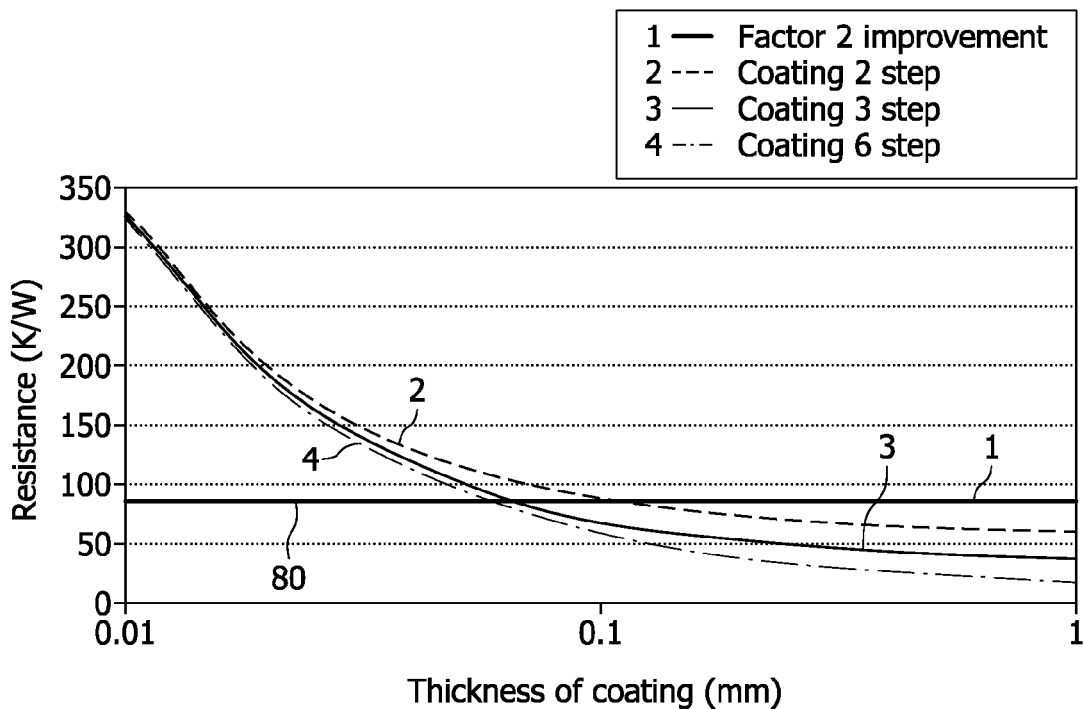
FIG. 8 shows resistance values for a Si3N4 layer.

Thus, in approximation, the heat conductive layer 6 gives a factor of 2 improvement in heat conductivity if its heat conductivity K and thickness d are chosen according to K·d=0.0032 W/K and for a greater improvement K·d≥0.0032 W/K. The calculation may also be done numerically. The result of such a calculation is shown in FIG. 8, which shows the calculated resistance values using $Si_3N_4$ (K=30) as heat conductive layer. FIG. 8 shows the calculated thermal resistance for the layer, as a function of thickness of the layer. The result of three different simulations is shown, each having a different number of 1 mm steps. The line 80 shows the required resistance for a factor of 2 improvement in heat conduction.

It can be seen that the number of steps in the calculation is important, but the approximation using 2 steps already gives an acceptable approximation. However, it should be noticed that the 2-step approximations results in an overestimation of the required thickness by around a factor 2.

Using the numerical model, the required thickness for the thermal conductive layer 6 can be calculated, for a factor of 2 improvement in heat conduction. The result is shown in Table 4.

TABLE 4

Calculated required thickness for a factor 2 improvement.

| Material | K | d (numerical) | d (analytical) | R thickness |
|---|---|---|---|---|
| Diamond DLC | 1000 | 2 µm | 3 µm | 1.6 10⁻⁴ K/W |
| Cu | 400 | 4 µm | 8 µm | 8 10⁻⁴ K/W |
| MgO | 53.5 | 40 µm | 60 µm | 0.06 K/W |
| $Si_3N_4$ | 30 | 80 µm | 107 µm | 0.22 K/W |

The value R thickness is based on the numerical thickness determined. Another restriction for the thermal conductive layer 6 is that it should not be too thick. This is required in order to prevent the layer 6 from acting as thermal insulating layer. Table 4 above shows the added resistance for the thermal conductive layer 6, as calculated with $$R = 1/K\frac{s}{A},$$

using A=(3.5 mm)². It also shows the required thickness to obtain the factor of 2 improvement. In order for the effect to be low, the resistance of the layer should be much lower than the resistance of the upper glass plate (R=85 K/W). For example, the resistance of the thermally conductive layer should be lower than 10% of this, and thus it should be lower than 8.5 K/W based on 85 K/W for a 1.1 mm thick glass plate. As can be seen from Table 4, all materials listed in this table agree to this.

The following conclusions can be drawn:

According to the analytical approximation, the heat conductive layer 6 gives a factor of 2 improvement in heat conductivity if its heat conductivity K and thickness d are chosen according to K·d=0.0032 W/K. If K*d is greater than this, the improvement is further increased.

According to a numerical model, the analytical approximation overestimates the required thickness by roughly a factor 2.

The thermal conductive layer should preferably be optically transparent and the optical transmission of the layer should preferably be similar for all wavelengths to avoid an undesired shift in LED color or color temperature. Preferably the optical transmission of the layer is >70% and more preferably >90% and >99%. Due to this, out of the list in Tables 2 and 4, Cu is a less suitable material. However, all the other materials in this list have a good transparency.

Figure 9:
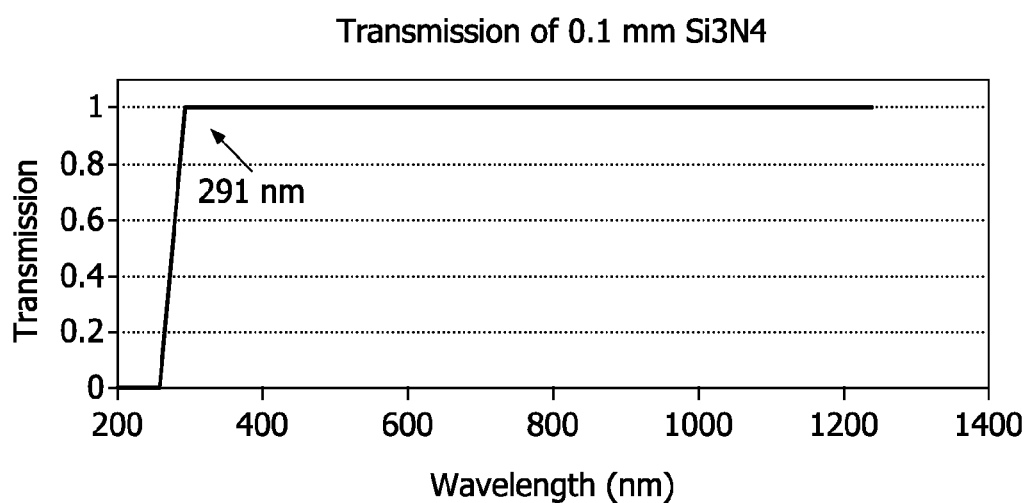
FIG. 9 shows transparency values for a 100 micrometer thick Si3N4 layer.
Figure 10:
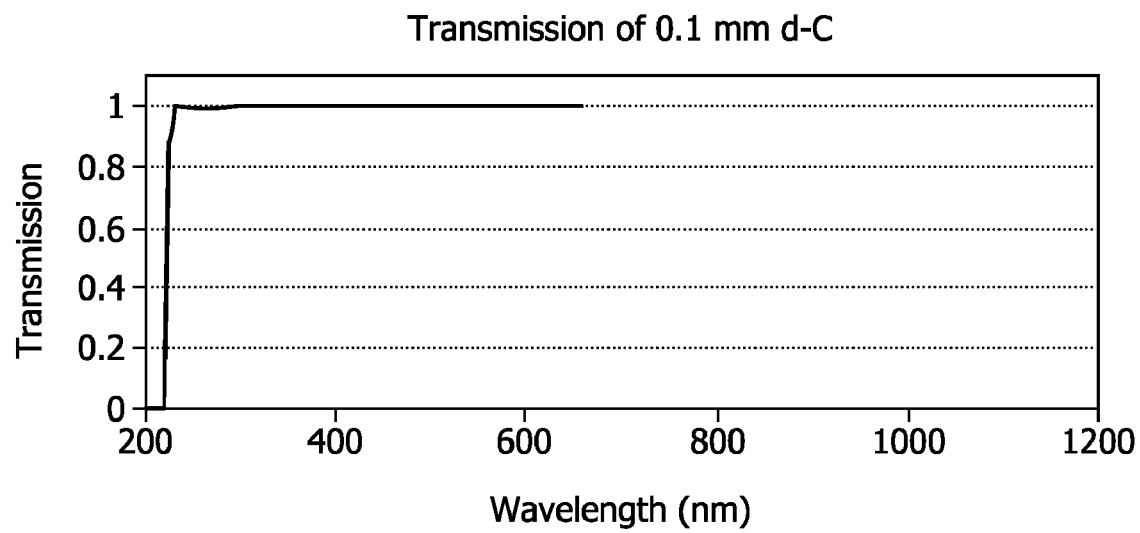
FIG. 10 shows transparency values for a 100 micrometer thick diamond layer.

As an example, FIG. 9 shows the optical transparency for 100 μm thick $Si_3N_4$, showing that it has a transparency >99% in the visible wavelength region. Similarly, FIG. 10 shows the light transmission for a 100 μm thick diamond layer.

Figure 11:
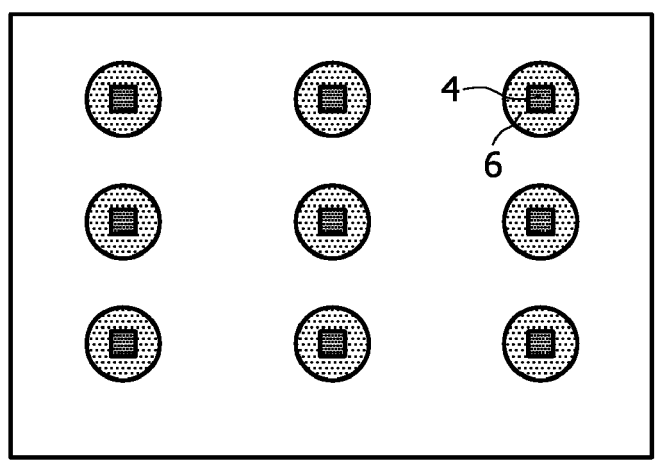
FIG. 11 shows a patterned heat conductive layer which can be used in the device of the invention.

In a further embodiment, the heat-conductive layer may be patterned, for example, as shown in FIG. 11. The additional layer 6 is thus provided in the vicinity of the LEDs 4, for example 3 to 10 mm around the LED locations. The heat-conductive layer may also be placed on the substrate as a separately formed layer, instead of coated on the substrate.

The examples above use a thermally conductive layer in addition to the normal electrode layout. However, the thermally conductive layer can also be used to form the conductor arrangement, if the layer has the required electrical conductivity properties. Alternatively, the thermally conductive layer can instead provide backup to reduce the electrical resistance of the electrodes.

The electrodes may not need to be semi-transparent, depending on the application. For example, a shelf can be made comprising one row of LEDs, and where the backs of the LEDs are hidden with a silkscreen printed line of width between 3 and 10 mm, providing electrical connections and high thermal conductivity.

Table 4 above shows that for a material such as Cu, the thickness of the layer should be around 4-8 micrometer. Thus, a silkscreen printed layer should have a similar thickness after 'curing' of the ink if it comprises Cu particles. A typical silkscreen printed line has a dry film thickness of around 1 to 2 mil (1 mil=0.025 mm), which is more than the minimum required thickness. Thus, silkscreen printed lines may be used for this purpose.

For the effect to work, the ink should comprise a high concentration of particles with high thermal conductivity. For example Electrodag 423SS consists of 36% finely divided graphite particles in a thermoplastic resin. This ink has a low electrical resistance, making it less suited as electrical conductor, but the thermal conductivity of graphite is known to be high. Thus, this material may be used as a thermally conductive layer. Because the ink is slightly electrically conductive, it should be either shielded from the electrical conductor arrangement, or it should be patterned in the same way as the electrical conductor arrangement.

It should be clear that it is also possible to use inks that are not electrically conductive, but that have a high thermal conductivity. For example an ink comprising finely divided electrically insulating particles (for example MgO) in a thermoplastic resin may be used.

An ink can serve as both the thermally and electrically conductive layer. For example Cu or Ag particles are suited for this. An example of a suitable ink is Electrodag SP-017, containing silver particles. Because this ink has a high electrical and thermal conductivity, it can serve both purposes of a thermally and electrically conductive layer. A material with a high heat conductivity and a high electrical conductivity can either function as the electrode pattern, or it can be patterned in a way similar to the transparent electrodes 3, to reduce the electrode resistance as well as increasing the heat transfer.

The heat-conductive layer (or layers) may also be comprised of multiple layers. For example, it may comprise a layer of an electrically conductive material, followed by a layer of a non-conductive material. The advantage of this approach is that the heat conductive layer does not interfere with the electronics on the glass, even though electrically conductive materials are used.

The analysis above is based on a specific LED dimension and heat output, as well as specific dimensions and materials for the substrates and other layers. It should be understood that the invention is applicable to a wide range of devices, and the scope of the invention will be understood more clearly from the claims.

The examples above have shown individual LEDs. However, it will be understood that the invention is typically implemented as many LEDs or LED groups, embedded in a large glass plate. A typical distance between the LEDs or LED groups may be 1 cm to 10 cm, for example approximately 3 cm.

The examples above use glass substrates, but it will be apparent that plastic
substrates may also be used.

A small number of possible materials to form the transparent (or at least semi-transparent) electrodes have been outlined above. Other examples can be found in U.S. Pat. No. 5,218,351, and include electrically conductive wires, with a diameter of approximately 0.1 mm spaced by about 10 mm or more, or with a diameter of approximately 20 um and spaced by 1 mm or more. The wires can be made from strands of gold, silver, copper, zinc or stainless steel. Alternatively, strands made of a resin such as polyester or nylon wires can be used, the outer surface of which is coated with metal by vapour deposition, metal plating or the like. Conductive films of vapour-deposited SiO2-indium alloy can also be used.

Thus, wires may be used instead of contact pads as shown, and the advantage of reducing the number of lines is still obtained.

The use of a conductive ink has been mentioned, and this can be deposited by inkjet printing as well as silkscreen printing mentioned above. The ink typically includes fine metal particles, such as silver, and has a conductance of less than 0.1 Ohm/square/mil. A typical wire width using ink is 0.08 mm to 0.8 mm.

Various other modifications will be apparent to those skilled in the art.

The invention claimed is:

1. A light output device, comprising at least one light source device integrated into a substrate arrangement comprising:
   at least one light transmissive substrate;
   a thermally insulating layer in thermal contact with the at least one light source device; and
   at least one thermally conductive layer in thermal contact with the at least one light source device;
   wherein the light source device is at least partly embedded in the thermally insulating layer.

2. A device as claimed in claim 1, wherein the thermally insulating layer (6a) has a thermal conductivity of less than 1 W/mK.

3. A device as claimed in claim 2, wherein the thermally insulating layer comprises a thermoplastic layer or resin.

4. A device as claimed in claim 1, comprising first and second light transmissive substrates, and first and second thermally conductive layers, wherein the first thermally conductive layer is provided on the first light transmissive substrate and the second thermally conductive layer is provided on the second light transmissible substrate.

5. A device as claimed in claim 4, wherein the first or the second thermally conductive layer has a thermal resistance less than 10% of the thermal resistance of the corresponding substrate on which it is provided.

6. A device as claimed in claim 1, wherein the first or the second thermally conductive layer has a thermal resistance less than 8.5 K/W.

7. A device as claimed in claim 1, wherein each thermally conductive layer (6a,6b) has a thickness d and a heat conductivity K, wherein K.d>0.002, in units of W/K.

8. A device as claimed in claim 1, wherein the thermally insulating layer comprises polyvinyl butyral or a UV resin.

9. A device as claimed in claim 1, wherein the at least one thermally conductive layer is patterned and the pattern comprises at least one region proximate to the light source device.

10. A device as claimed in claim 1, wherein the at least one thermally conductive layer is transparent.

11. A device as claimed in claim 1, wherein the at least one thermally conductive layer comprises diamond-like-carbon, MgO or Si3N4.

12. A device as claimed in claim 1, wherein the substrate arrangement comprises first and second substrates and further comprises an electrode arrangement sandwiched between the substrates, wherein the at least one light source device is connected to the electrode arrangement.

13. A device as claimed in claim 12, wherein the electrode arrangement comprises substantially transparent Indium Tin Oxide, Indium Zinc Oxide, Tin Oxide or Fluorine Doped Tin Oxide.

14. A device as claimed in claim 12, wherein the thermally conductive layer is electrically conductive and is patterned to at least partly correspond to the electrode arrangement.

15. A device as claimed in claim 1, wherein the light source device comprise one or more LED light sources.

16. A device as claimed in claim 15, wherein the light source device comprises one ore more inorganic LEDs, organic LEDs, polymer LEDs or laser diodes.

17. A light output device, comprising
at least one light source device integrated into a substrate arrangement comprising:
at least one light transmissive substrate;
a thermally insulating layer in thermal contact with the at least one light source device; and
at least one thermally conductive layer in thermal contact with the at least one light source device wherein the at least one thermally conductive layer is patterned and the pattern comprises at least one region proximate to the light source device.

* * * * *